United States Patent
Tsai et al.

(10) Patent No.: US 8,201,338 B2
(45) Date of Patent: Jun. 19, 2012

(54) POSITIONING DEVICE USED IN ANTENNA TESTING SYSTEM AND A METHOD OF ACCURATELY POSITIONING A TESTING ANTENNA

(75) Inventors: Wen-Kai Tsai, Tu-Cheng (TW); Hsin-Kuo Dai, Tu-Cheng (TW); Kun-Te Cheng, Tu-Cheng (TW); Kai Yang, Tu-Cheng (TW); Hsiang-Hui Shen, Tu-Cheng (TW); Yu-Min Wang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 306 days.

(21) Appl. No.: 12/503,040

(22) Filed: Jul. 14, 2009

(65) Prior Publication Data

US 2010/0005670 A1 Jan. 14, 2010

(30) Foreign Application Priority Data

Jul. 14, 2008 (TW) .................................. 97126584

(51) Int. Cl.
*G01C 15/00* (2006.01)

(52) U.S. Cl. ............................................. 33/228; 33/286
(58) Field of Classification Search .................. 33/228, 33/290, DIG. 21
See application file for complete search history.

(56) References Cited

U.S. PATENT DOCUMENTS 6,243,042 B1 * 6/2001 d'Auria et al. ................. 343/703
6,310,579 B1 * 10/2001 Meredith ....................... 343/703

FOREIGN PATENT DOCUMENTS

CN 2379924 Y 5/2000
CN 101082485 A 12/2007

\* cited by examiner

*Primary Examiner* — Yaritza Guadalupe-McCall
(74) *Attorney, Agent, or Firm* — Wei Te Chung; Andrew C. Cheng; Ming Chieh Chang

(57) ABSTRACT

A positioning device, used in antenna's testing system, includes a crane, a fastening device, a testing antenna and a laser generator. The crane includes a gearing with a sliding shoe thereon. The fastening device is fixed on the sliding shoe of the crane. The testing antenna is fixed in font of the fastening device. The laser generator is fastened on the fastening device and located on a level different from the testing antenna. The laser generator sends out laser for defining the position of the testing antenna.

15 Claims, 5 Drawing Sheets

POSITIONING DEVICE USED IN ANTENNA TESTING SYSTEM AND A METHOD OF ACCURATELY POSITIONING A TESTING ANTENNA

BACKGROUND OF THE INVENTION

1. Field of the Invention

The present invention relates generally to a positioning device, and more particularly to a positioning device used in antenna's testing system.

2. Description of the Prior Art

An antenna's testing system is used to test antenna's radiance for judge if the antenna meets the demand. A 3D graphic showed the antenna's working field form and a gain of the antenna are both important parameter showed the antenna's radiance. And the 3D graphic is produced by a 3D testing system working in a anechoic chamber. The 3D testing system generally includes an antenna under test, a rotatable support, a testing antenna and a crane supporting the testing antenna. The crane provides a position to the testing antenna to make the testing antenna aimed for the antenna under test.

Referencing to FIG. 1, a prior antenna's testing system A is shown. The system A includes an under-test antenna B, a rotatable support C to support the under-test antenna B, a testing antenna D, a crane E and a control system F. When the under-test antenna B is tested, the testing antenna D is adjusted to located on a height and to be aimed to the under-test antenna B. However, the testing system A fails to equip a calibrating equipment, and thus, the testing antenna D is helluva to be exactly aimed to the under-testing antenna.

Hence, in this art, a positing device to overcome the above-mentioned disadvantages of the prior art should be provided.

BRIEF SUMMARY OF THE INVENTION

A primary object, therefore, of the present invention is to provide a accurate positioning device.

In order to implement the above object, the positioning device, used in antenna's testing system, comprises a crane, a fastening device, a testing antenna and a laser generator. The crane comprises a gearing with a sliding shoe thereon. The fastening device is fixed on the sliding shoe of the crane. The testing antenna is fixed in font of the fastening device. The laser generator is fastened on the fastening device and located on a level different from the testing antenna. The laser generator sends out laser for defining the position of the testing antenna.

Other objects, advantages and novel features of the invention will become more apparent from the following detailed description of a preferred embodiment when taken in conjunction with the accompanying drawings.

DETAILED DESCRIPTION OF THE INVENTION

Reference will now be made in detail to a preferred embodiment of the present invention.

Figure 1:
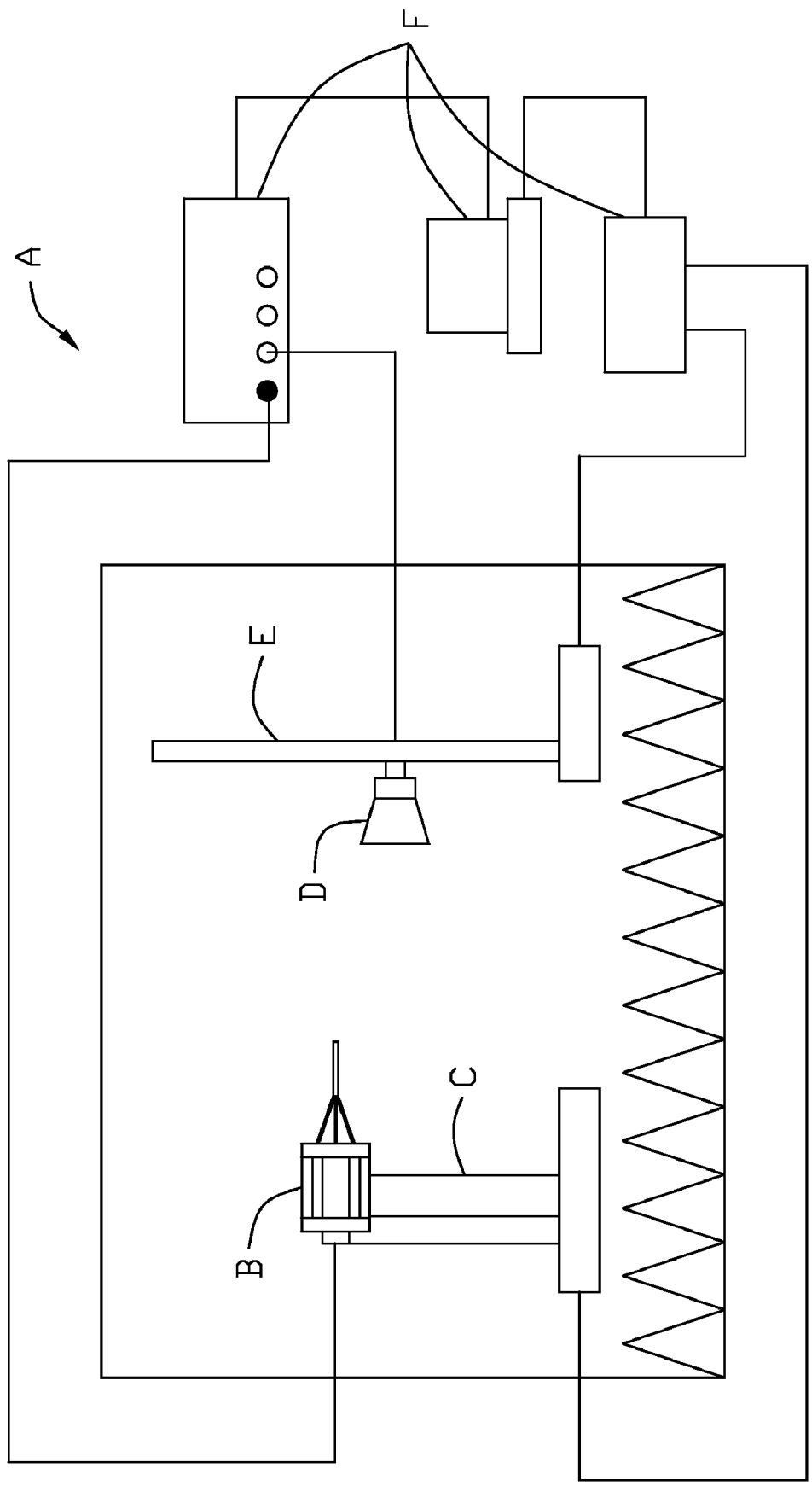
FIG. 1 is an abridged general view of a conventional antenna's testing system.
Figure 2:
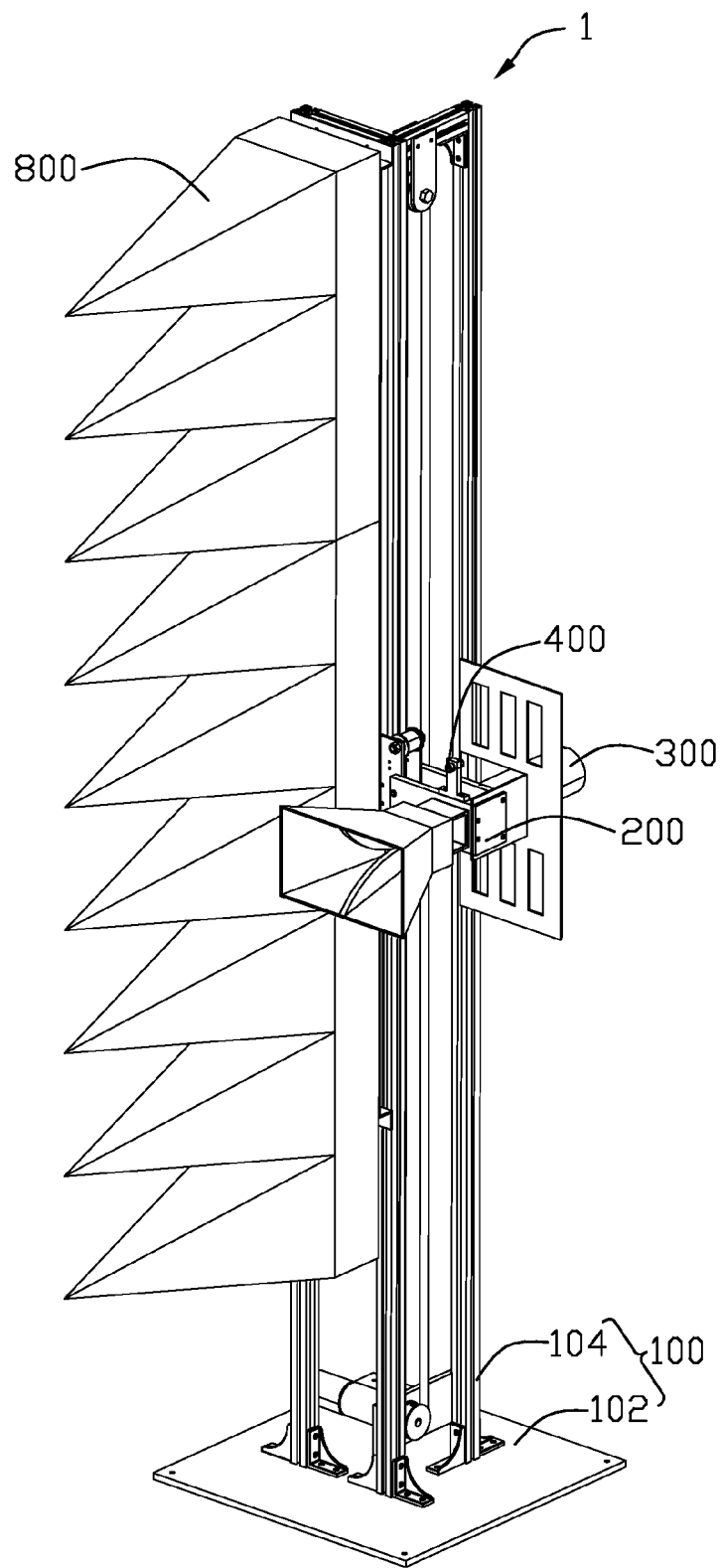
FIG. 2 is a perspective view of a positioning device in according with the present invention.
Figure 3:
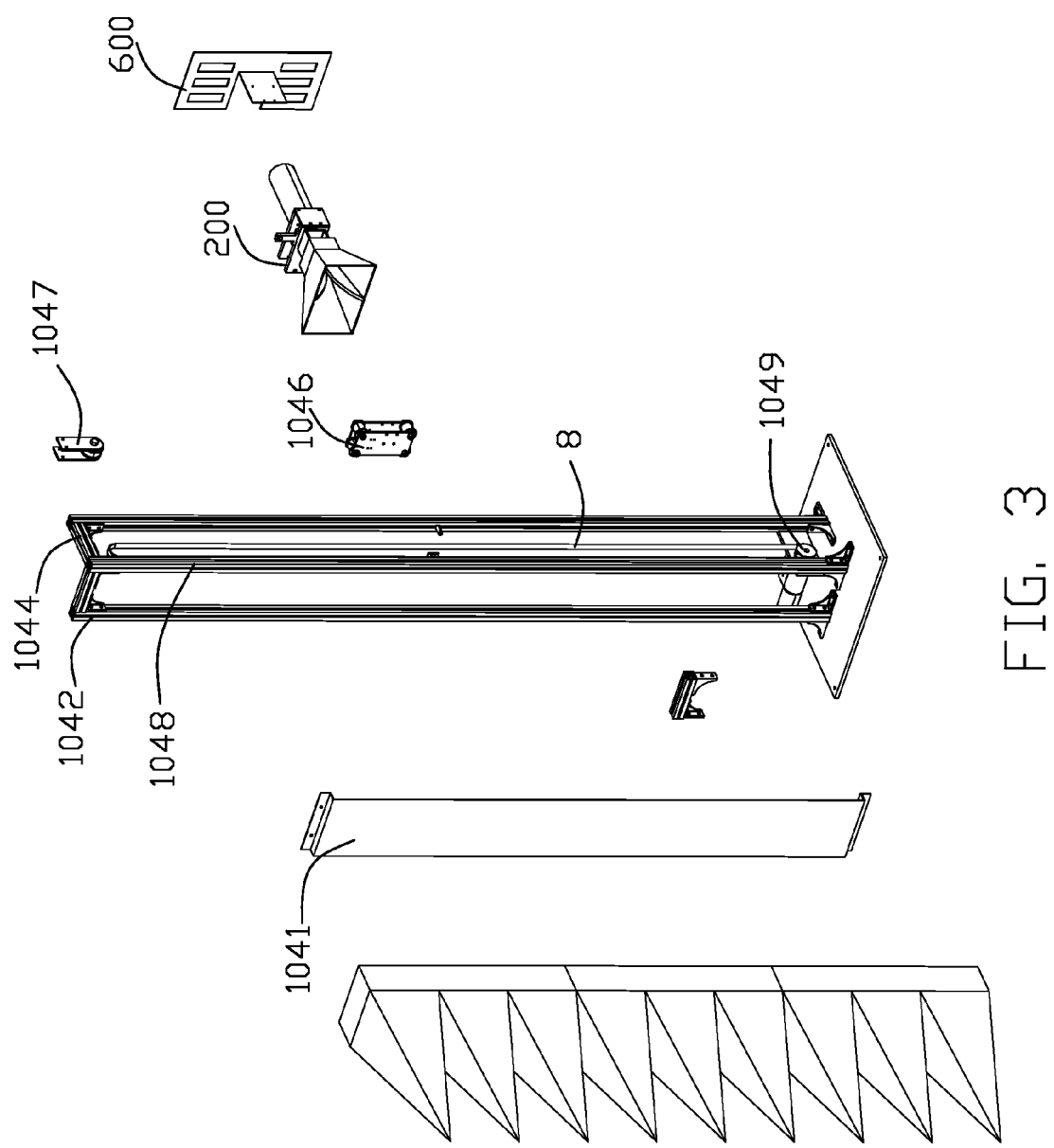
FIG. 3 is an exploded, perspective view of FIG. 2.
Figure 4:
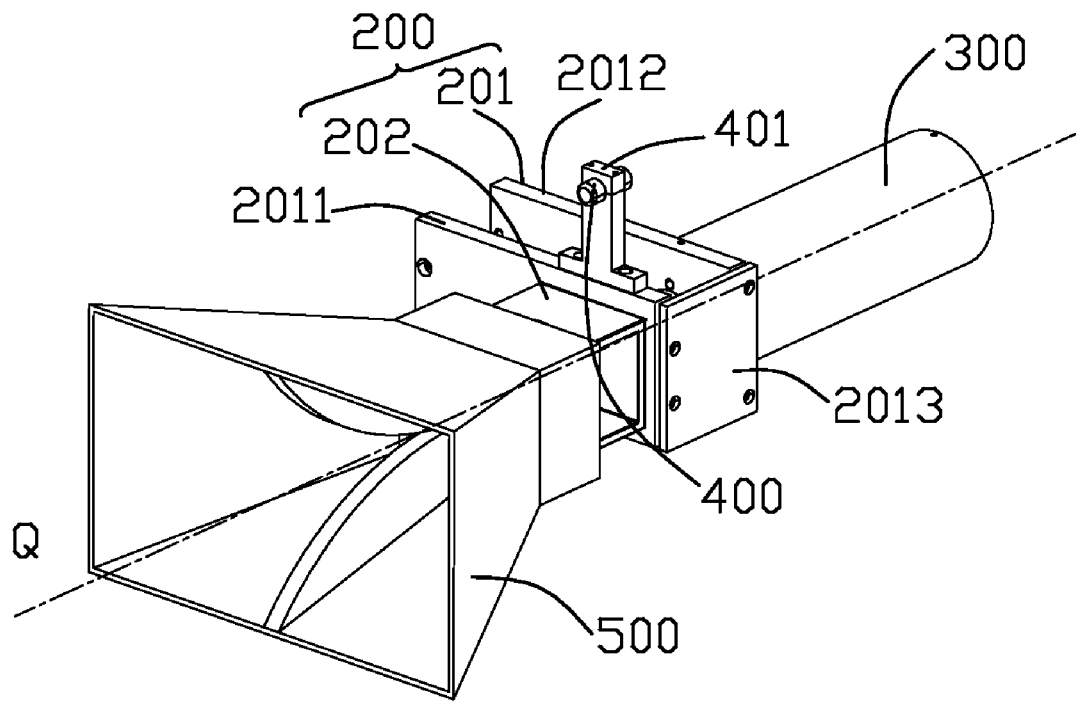
FIG. 4 is a perspective view of part elements of the positioning device.
Figure 5:
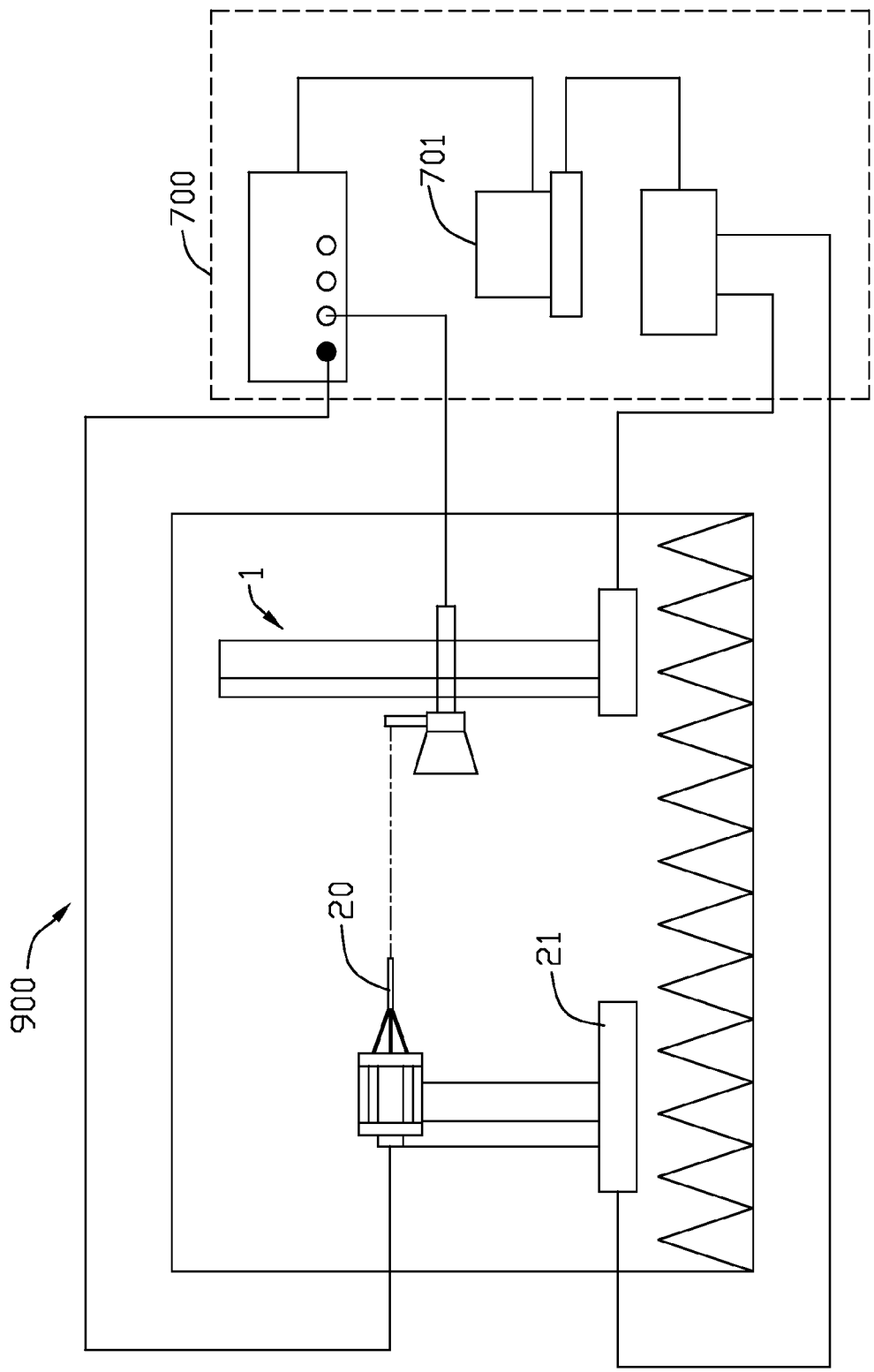
FIG. 5 is an abridged general view of the antenna's testing system of the present invention.

Reference to FIGS. 2 to 4, a positioning device 1 is shown, and the positioning device 1 is a part of an antenna's testing system 900 (shown in FIG. 5). The positioning device 1 includes a crane 100, a fastening device 200 fastening the crane 100 on a ground (not shown), a control device 300, a laser generator 400, and a monopole testing antenna 500.

The crane 100 includes a base portion 102 and a supporting frame 104 fastened on the base portion 102. The supporting frame 104 includes three vertical rims and two perpendicular rims as to form a first rectangular casing 1042 and a second rectangular casing 1044. The first and second rectangular casings 1042, 1044 share a common vertical rim 1048 and a certain angle is formed between the first and the second rectangular casings 1042, 1044. A board 1041 is defined across most part of the first rectangular casing 1042 and a group of wave-absorbing material 800 is fastened on the board 1041. A gearing, which is composed by a belt 8 and a pulley, is located on the second rectangular casing 1044. The pulley includes a sliding shoe 1046 located on the common rim 1048, an upper chain wheel 1047, and a lower chain wheel 1049. The lower chain wheel 1049 is connected to a motor (not shown). When the motor drives the lower chain wheel 1049 turning, the sliding shoe 1046 can move downwards or upwardly through the belt's 8 transmission.

The fastening device 200 comprises a fastening element 201 and a gear-shifting element 202. The fastening element 201 includes three rectangular boards 2011, 2012, 2013. The first rectangular board 2011 and the second rectangular board 2012 both extend along a horizontal left-to-right direction and are fastened on the sliding shoe 1046 so as to move following the sliding shoe 1046. The third rectangular board 2013 connects the first rectangular board 2011 with the second rectangular board 2012 on one side of the first and second rectangular board 2011, 2012 opposite to the supporting frame 104. A plate 600 extends along a plane perpendicularly to the third rectangular board 2013 and parallel to the first and second rectangular board 2011, 2012. The plate 600 is located behind the fastening device 200 and is used to fasten some wave-absorbing material (not shown) thereon. The gear-shifting element 202 extends along a horizontal front-to-back direction for connecting the control device 300 and the testing antenna 500. The testing antenna 500 is located in the front of the gear-shifting element 202 and the control device 300 is connected to the rotating shaft (not shown).

The control device 300 is composed by a motor (not shown), a gear (not shown) and an angle detector (not shown). The motor and the gear are used to control the gear-shifting element 202 so as to control the testing antenna's turning. The angel detector is used to know how many degrees the testing antenna turned.

The laser generator 400 is fastened on the front upper surface of the first rectangular board 2011 of the fastening device 200 through a bracket 401. The laser generator 400 is located higher than the top of the testing antenna and connected to a control system 700 (shown in FIG. 5) of the antenna's testing system 900 (shown in FIG. 5).

Referencing to FIGS. 2-5, the antenna's testing system 900 includes an under-test antenna 20, a rotatable support 21 to support the under-test antenna 20, a testing antenna 500, a positioning device 1 and a control system 700. The rotatable support 21 and the positioning device 1 are both connected to the control system 700 so as to be controlled by a computer 701 or a remote-control unit (not shown) of the control system 700. When the under-test antenna 20 is tested, the under-test antenna 20 and the testing antenna 500 should be regulated on a right position firstly. In regulation, it is the first that an emission centre of the under-test antenna 20 should be kept to located on a plane the same as which an emission centre of the testing antenna 500 is located on, which can be achieved by adjusting the rotatable support 21. Secondly, start the laser generator 400 to send out red light. And then, adjust the sliding shoe 1046 through the control system 700 and the gearing so as to the testing antenna 500, the laser generator 400 and the control device 300 move following the sliding shoe 1046. When the red light (laser) project on the emission centre of under-tasting antenna 20, close the laser generator 4 and the testing antenna 500 would automatically move upwardly to the original position of an emission centre of the laser generator 4. At this time, the testing antenna 500 is in alignment with the under-test antenna 20. At last, examine the polarization direction of the testing antenna 500. If the polarization direction of the testing antenna 500 is different from the polarization direction of the under-test antenna 20, start the control device 300 to turn the resting antenna 500 so as to make the two antennas own same polarization direction.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A positioning device, used in antenna's testing system, comprising:
    a crane, comprising a gearing with a sliding shoe thereon;
    a fastening device, fixed on the sliding shoe of the crane;
    a testing antenna, fixed in font of the fastening device and being in a self-rotatable manner; and
    a laser generator, fastened on the fastening device and located on a level different from the testing antenna;
    said laser generator sending out laser for defining the position of the testing antenna.

2. The positioning device as claimed in claim 1, wherein the crane comprises a first and second rectangular casing which an angle is formed between and defines a common rim.

3. The positioning device as claimed in claim 2, wherein the sliding shoe is fixed on the common rim of the fastening device.

4. The positioning device as claimed in claim 2, wherein first rectangular casing has a board located on a front surface thereof to fasten some wave-absorbing material.

5. The positioning device as claimed in claim 1, wherein the fastening device comprises a fastening element and a gear-shifting element, said fastening element is fixed on the sliding shoe and the gear-shifting element extends along a horizontal front-to-back direction.

6. The positioning device as claimed in claim 5, wherein the positioning device further comprises a control device connected to the back of the gear-shifting element so as to control a turn of the testing antenna for changing the testing antenna's polarization direction.

7. The positioning device as claimed in claim 1, wherein the laser generator is fixed on an front upper surface of the fastening element through a bracket.

8. The positioning device as claimed in claim 1, wherein the laser generator is higher than a top of the testing antenna.

9. The antenna testing assembly as claimed in claim 1, wherein said testing antenna is rotatable about a horizontal axis perpendicular to a sliding direction of the sliding shoe.

10. A method of positioning a testing antenna, used in an antenna's testing system to test an under-test antenna, comprising:
    a first step, providing a crane, said crane comprising a sliding shoe thereon;
    a second step, providing a laser generator and a testing antenna which both are located on the sliding shoe and each locates on a levels different from each other;
    a third step, providing a control system and connecting the laser generator with the control system;
    a fourth step, starting the laser generator to send out laser;
    a fifth step, adjusting the position of the laser generator until the laser projects on the under-test antenna; and
    a sixth step, closing the laser generator and the testing antenna would automatically move upwardly to the original position of an emission centre of the laser generator.

11. The method as claimed in claim 10, wherein said laser generator is controlled by a computer or a remote-control unit.

12. The method as claimed in claim 10, wherein said third step further comprises that provide a control device and a gear-shifting element connecting the control device with the testing antenna, and connecting the control device to the control system.

13. The method as claimed in claim 12, wherein said method further comprises a seventh step that examine the polarization direction of the testing antenna, and if the polarization direction of the testing antenna is different from the polarization direction of the under-test antenna, start the control device to turn the resting antenna so as to make the two antennas own same polarization direction.

14. A antenna testing assembly comprising:
    an under-test antenna located at a fixed position;
    a testing antenna moveable along a first axis facing toward the under-test antenna;
    a laser generator associated with the testing antenna and movable along said first axis so as to precisely define relative positions between the under-test antenna and the testing antenna to have a line, which is defined between the under-test antenna and the testing antenna, be perpendicular to said first axis; and
    said testing antenna being self-rotatable about a second axis, which is perpendicular to the first axis, for having polarization of the testing antenna comply with that of the under-test antenna.

15. The antenna testing assembly as claimed in claim 14, wherein said laser generator is essentially located in alignment with said testing antenna along said first axis during adjusting a position of said testing antenna relative to the under-test antenna along said axis.

* * * * *